(12) United States Patent
Hsiao et al.

(10) Patent No.: US 12,074,830 B2
(45) Date of Patent: Aug. 27, 2024

(54) MILLIMETER-WAVE FULLY-INTEGRATED FULL DUPLEXER MODULES WITH AND WITHOUT INTERNAL LOW NOISE AMPLIFIER AND POWER AMPLIFIER FOR 5G APPLICATIONS

(71) Applicant: The Texas A&M University System, College Station, TX (US)

(72) Inventors: Meng-Jie Hsiao, Dallas, TX (US); Cam V. Nguyen, Newport Coast, CA (US)

(73) Assignee: THE TEXAS A&M UNIVERSITY SYSTEM, College Station, TX (US)

( * ) Notice: Subject to any disclaimer, the term of this patent is extended or adjusted under 35 U.S.C. 154(b) by 348 days.

(21) Appl. No.: 17/434,808

(22) PCT Filed: Mar. 25, 2020

(86) PCT No.: PCT/US2020/024698
§ 371 (c)(1),
(2) Date: Aug. 30, 2021

(87) PCT Pub. No.: WO2020/198349
PCT Pub. Date: Oct. 1, 2020

(65) Prior Publication Data
US 2022/0166597 A1 May 26, 2022

Related U.S. Application Data

(60) Provisional application No. 62/823,127, filed on Mar. 25, 2019, provisional application No. 62/851,313, filed on May 22, 2019.

(51) Int. Cl.
*H04L 5/14* (2006.01)
*H01P 5/12* (2006.01)
*H03F 3/24* (2006.01)

(52) U.S. Cl.
CPC .............. *H04L 5/1438* (2013.01); *H01P 5/12* (2013.01); *H03F 3/245* (2013.01); *H03F 2200/294* (2013.01); *H03F 2200/451* (2013.01)

(58) Field of Classification Search
CPC .......... H04L 5/1438; H01P 5/12; H03F 3/245; H03F 2200/294; H03F 2200/451
See application file for complete search history.

(56) References Cited

U.S. PATENT DOCUMENTS 7,002,511 B1 *  2/2006  Ammar ................... G01S 7/032
                                          342/134
10,491,176 B1 *  11/2019  Hur ......................... H03F 3/191
(Continued)

FOREIGN PATENT DOCUMENTS

CN          108183301 A       6/2018

OTHER PUBLICATIONS

PCT/US2020/024698 International Search Report and Written Opinion dated Jun. 29, 2020 (2238-12501) (23 p.).
(Continued)

*Primary Examiner* — Mohammad S Anwar
(74) *Attorney, Agent, or Firm* — CONLEY ROSE, P.C.

(57) ABSTRACT

Architectures of millimeter-wave (mm-wave) fully-integrated frequency-division duplex (FDD) transmitting-receiving (T/R) front-end (FE) modules include a duplexer (DUX), power amplifier (PA), and low noise amplifier (LNA) on a single semiconductor substrate to facilitate the development of system on a chip (SoC) for mm-wave 5th Generation (5G) wireless communications applications. The first FE module adopts a passive DUX consisting of Wilkinson power divider and ground-center-tap transformer to achieve high isolation between PA output and LNA inputs. Another FE module combines the advantages of passive DUX and power-efficient cancellation circuits to accomplish
(Continued)

high TX-RX isolation and low noise performance at the same time. The DUX can stand alone as a single unit in a system and is used together with external PA and LNA provided in the system, or it can include its own internal PA and LNA to form a DUX FE module.

18 Claims, 6 Drawing Sheets

(56) References Cited

U.S. PATENT DOCUMENTS

| | | | |
|---|---|---|---|
| 2002/0151291 A1 | 10/2002 | Toncich | |
| 2004/0166804 A1* | 8/2004 | Moloudi | H03H 11/1291 455/20 |
| 2005/0035824 A1* | 2/2005 | Kearns | H01P 1/15 333/126 |
| 2006/0267734 A1* | 11/2006 | Taki | G06K 7/0008 340/572.4 |
| 2009/0213770 A1 | 8/2009 | Mu | |
| 2014/0312972 A1 | 10/2014 | Yoneda et al. | |
| 2015/0222412 A1 | 8/2015 | Laughlin et al. | |
| 2015/0346322 A1* | 12/2015 | Schmalenberg | H01Q 13/206 342/175 |
| 2017/0134067 A1 | 5/2017 | Le-Ngoc et al. | |
| 2018/0254931 A1 | 9/2018 | Gardner | |

OTHER PUBLICATIONS

Elkholy, Mohamed, "Circuits and Systems for On-Chip RF Chemical Sensors and RF FDD Duplexer," Dec. 2016 (https://oaktrust.library.tamu.edu/bitstream/handle/1969.1/158977/ELKHOLY-DISSERTATION-2016.pdf?sequence=1&isAllowed=y) (2238-12501) (203 p.).

Meng, Fangyu, "High-Isolation Low-Power Active Quasi-Circulator for 44GHZ Transceiver with Power and Noise Optimization in 0.18 Micrometer Bicmos," Dec. 2014 (http://oaktrust.library.tamu.edu/bitstream/handle/1969.1/153888/MENG-THESIS-2014.pdf?sequence=1&isAllowed=y) (2238-12501) (71 p.).

* cited by examiner

MILLIMETER-WAVE FULLY-INTEGRATED FULL DUPLEXER MODULES WITH AND WITHOUT INTERNAL LOW NOISE AMPLIFIER AND POWER AMPLIFIER FOR 5G APPLICATIONS

CROSS-REFERENCE TO RELATED APPLICATIONS

This application is a 35 U.S.C. § 371 national stage application of PCT/US2020/024698 filed Mar. 25, 2020, and entitled "Millimeter-Wave Fully-Integrated Full Duplexer Modules With and Without Internal Low Noise Amplifier and Power Amplifier for 5G Applications," which claims the benefit of U.S. Provisional Application Ser. No. 62/823,127, filed on Mar. 25, 2019, and entitled "A Wideband Millimeter-Wave Fully-Integrated Duplexer with Internal Low Noise Amplifier and Power Amplifier for 5G Applications," and U.S. Provisional Application Ser. No. 62/851,313, filed on May 22, 2019, and entitled "A Narrowband Millimeter-Wave Fully-Integrated Duplexer with Internal Low Noise Amplifier and Power Amplifier for 5G Applications." The afore-mentioned applications are hereby incorporated herein by reference in their entireties for all purposes.

STATEMENT REGARDING FEDERALLY SPONSORED RESEARCH OR DEVELOPMENT

Not Applicable.

BACKGROUND

In a 5th Generation (5G) wireless system operating at millimeter-wave (mm-wave) frequencies, for example, operating at 28 gigahertz (GHz), 37 GHz, and/or 39 GHz, signal transmission and reception prefer using a single antenna for small system size and to support effective low-cost transmission and reception operations. Further, a frequency-division duplex (FDD) technique can transmit and receive signals simultaneously to enhance data throughput and fast operation, and hence is desirable for 5G applications. An FDD 5G system requires a duplexer to separate signals that are transmitted by the antenna and received at the antenna. The duplexer also prevents transmit signals from a power amplifier (PA) from desensitizing received signals at a low noise amplifier (LNA). Such a duplexer can stand alone as a single unit in a system and is used together with external PA and LNA provided in the system, or it can include its own internal PA and LNA to form a duplexer module.

In some approaches, duplexers have been designed using surface acoustic wave (SAW) or bulk acoustic wave (BAW) filters, ferrite circulators, active devices, or passive components. SAW or BAW filters are not easy to operate above 10 GHz; ferrite circulators are bulky and hard to integrate into integrated circuits, and reported passive components operate in a narrow bandwidth and occupy a large chip area. Active devices are inherently non-linear and require high power consumption in order to achieve sufficient linearity for large PA signals. Active devices with high power consumption also degrade the receiver noise performance. One passive approach uses an electrical balanced duplexer (EBD). However, EBDs are difficult to operate above 2.5 GHz and an external matching network is needed at a transmit port of the EBD to interface with a power amplifier, which adds complexity and size to the duplexer. Moreover, those EBDs degrade the transmit and receive (TX-RX) isolation at high frequencies, impeding them as viable candidates for mm-wave 5G systems.

BRIEF SUMMARY OF THE DISCLOSURE

In an embodiment, a front-end (FE) circuit in a 5th Generation (5G) wireless system comprises a front end (FE) device for a 5th Generation (5G) wireless communication application and includes a duplexer (DUX) comprising a power divider and a transformer, a power amplifier (PA) including a main amplifier stage, wherein the PA output is coupled to the power divider, and a low-noise amplifier (LNA) coupled to the power divider. In embodiments, a transmit (TX) port is coupled to the PA and configured to inject a transmitting signal, an antenna (ANT) port is coupled to the DUX and configured to transmit and receive signals to and from the air, and a receive (RX) port is coupled to the LNA inputs. In embodiments, the DUX further comprises a transformer and a power divider, wherein the power divider is configured as a Wilkinson power divider that is configured to provide a low pass response to a signal from the PA. In embodiments, the transformer comprises a 1:N turns ratio transformer or a N:1 turns ratio transformer, wherein a coils ratio of the 1:N turns ratio transformer or the N:1 turns ratio transformer is capable of being increased to increase isolation between the TX port and the RX port or lower insertion loss between the ANT port and the RX port. In embodiments, the 1:N turns ratio transformer or the N:1 turns ratio transformer comprises primary windings and secondary windings, wherein a center tap of the primary or secondary windings is configured to be coupled to ground to improve the balance of the RX differential signals and increase TX-RX isolation. In embodiments, a feed forward circuit coupled between the TX port and the RX port, wherein the feed forward circuit is configured to generate a compensation signal that suppresses a leakage signal from the DUX. In embodiments, feed forward circuit comprises a transformer coupler coupled to the TX port and configured to output a portion of an input signal from the TX port as a first signal, a variable gain amplifier (VGA) coupled to the transformer coupler and configured to amplify the first signal as a second signal, and a phase shifter coupled to the VGA and to the LNA and configured to output the compensation signal, wherein the compensation signal comprises a phase-shifted signal of the second signal. In embodiments, the DUX comprises a single-ended input port and differential output ports, where a first impedance of the input port is matched to an output impedance of the PA, and a second impedance of each of the differential output ports is matched to an input impedance of the LNA.

In an embodiment, a duplexer in a 5th Generation (5G) wireless system comprises a duplexer (DUX) for a 5th Generation (5G) wireless communication application, comprising a Wilkinson power divider and a transformer electrically coupled to the power divider and configured as a high pass filter. In embodiments, the Wilkinson power divider is configured to provide a low pass response to an input signal that is received from a power amplifier. The transformer comprises a 1:N turns ratio transformer or a N:1 turns ratio transformer, wherein the coils ratio of the 1:N turns ratio transformer or the N:1 turns ratio transformer is capable of being increased to improve TX-RX isolation or improve RX insertion loss, In embodiments, the 1:N turns ratio transformer or the N:1 turns ratio transformer comprises primary windings and secondary windings, wherein a center tap of the primary or secondary windings is configured to be coupled to ground to i the TX-RX isolation and increase the balance of the RX differential signals. The primary winding comprises inductances that are configured to reduce the insertion loss. In embodiments, the DUX comprises an antenna (ANT) port coupled to the Wilkinson power divider and to the transformer, a transmit (TX) port coupled to the Wilkinson power divider, and differential output receive (RX) ports coupled to the transformer. The TX port comprises an input impedance that is matched to a characteristic impedance of a power amplifier: In embodiments, the DUX comprises a second ANT port coupled to the Wilkinson power divider, wherein the second ANT port comprises an impedance that is matched to an impedance of ANT port. The Wilkinson power divider is configured to provide an equal phase output signal to each of the ANT port and the second ANT port.

Embodiments described herein comprise a combination of features and advantages intended to address various shortcomings associated with certain prior devices and systems. The foregoing has outlined rather broadly the features and technical advantages of the invention in order that the detailed description of the invention that follows may be better understood. The various characteristics described above, as well as other features, will be readily apparent to those skilled in the art upon reading the following detailed description, and by referring to the accompanying drawings. It should be appreciated by those skilled in the art that the conception and the specific embodiments disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a detailed description of the embodiments of the invention, reference will now be made to the accompanying drawings in which.

DETAILED DESCRIPTION OF THE EMBODIMENTS

Figure 1:
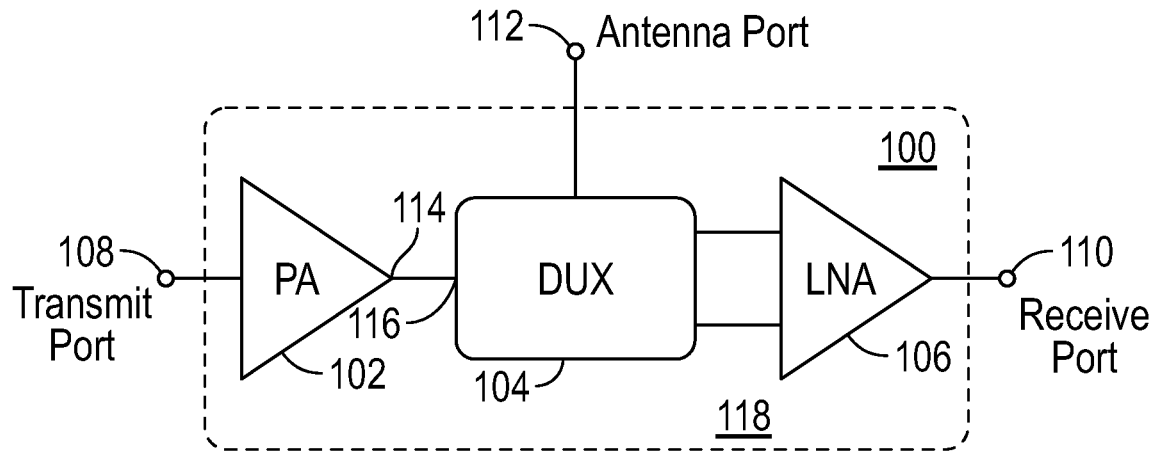
FIG. 1 is an illustrative schematic block diagram of a wideband front-end (FE) device including a wideband DUX module with internal PA and LNA in accordance with various embodiments.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the terms "couple", "coupled" or "couples" is intended to mean either an indirect or direct connection. Thus, if a first device couples to a second device, that connection may be through a direct connection of the two devices, or through an indirect connection that is established via other devices, components, nodes, and/or connections.

5G wireless systems may operate at mm-wave frequencies between 24 GHz-86 GHz. Using time division duplexing (TDD) or frequency division duplexing (FDD) techniques, 5G systems may use a power amplifier (PA) to transmit signals from an antenna and use a low-noise amplifier (LNA) to receive signals from the antenna. Therefore, the PA and LNA may share a single antenna during transmission and reception. While an antenna transmits at different time periods in TDD, however, FDD allows the antenna to transmit and receive signals at the same time or at a different time (with proper modification). Therefore, a duplexer (DUX) may be needed at the antenna to separate transmit and receive signals when implementing FDD. A DUX needs to have high isolation between the PA output and the LNA input and low insertion loss between the transmit, antenna, and receive ports. Isolation is the ratio of power in decibel (dB) which is propagated between the transmit port and the receive port as a leakage signal. Providing higher isolation may prevent large signals from the transmit port from desensitizing small signals received by the LNA. Insertion loss may be measured between the antenna port and the receive port (ILRX), or the transmit port and the antenna port (ILTX). ILRX is the loss in dB between the antenna port and the receive port. ILTX is the loss in dB between the transmit port and the antenna port. A few conventional solutions implementing FDD techniques use surface acoustic wave (SAW) or bulk acoustic wave (BAW) filters, ferrite circulators, or active devices. However, these solutions are not as effective in 5G wireless systems.

In an embodiment, a 5G wireless system front-end (FE) circuit for FDD comprises a fully-integrated duplexer, power amplifier, and a low-noise amplifier on a single 0.18-μm BiCMOS silicon substrate. In an embodiment, duplexer may provide impedance matching to each of a TX port, ANT port, and differential RX ports. The impedance matching may facilitate integration with a PA, ANT and an LNA. In an embodiment, impedances at the TX port may be matched to a 50 ohm (Ω) load, and impedance at an ANT port may be matched using a Wilkinson power divider to 50Ω. The RX ports may be matched to an impedance of RRX, which may be larger than 50Ω for optimum gain and noise matching to an LNA. In an embodiment, FE circuit may be designed to provide high-isolation between a PA output and an LNA input. In an example, FE circuit may provide at least 40 dB isolation between PA output and LNA input over a frequency range of 15 GHz to 60 GHz. The FE circuit integrated with PA and LNA may be designed to have certain gain, noise figure, output power, and isolation, such as 20.8 dB gain with a 13.5 dB minimum noise figure (NF) at 28 GHz for the entire receive path, and about 12 dB gain with better than 11 dBm maximum output power across 23.5 GHz-36.2 GHz for the transmit path, in a design example.

In another embodiment, a 26.5 GHz-36.2 GHz wideband FDD DUX includes a lumped-element Wilkinson power divider integrated with a grounded-center-tap transformer on a substrate. In an embodiment, the DUX uses 0.18 μm BiCMOS devices may be used for 5G at 28 GHz, 37 GHz, 39 GHz, and higher frequencies. The DUX includes single-ended transmitter and antenna ports and a differential receiver port. The DUX includes impedance matching at a transmitter port, at an antenna port, and at a receive port, high isolation between the transmitter and receiver ports, and highly balanced differential receiver waveforms, and is ready for direct integration with a differential low-noise amplifier. Analysis has been performed to confirm the DUXs characteristics and assess its performance. Performance has been demonstrated in a design example as follows. Measured RF isolation from TX to each single-ended RX port is higher than 50 dB from dc-20 GHz and higher than 40 dB from dc-60 GHz. Measured insertion loss from TX to antenna is better than 6.3 dB across 13-53 GHz. Measured insertion loss from ANT to differential RX port is 10.8 dB at 40 GHz and lower than 13.8 dB from 25-57 GHz. The core chip only occupies 0.3-mm².

Referring to the figures, FIG. 1 shows an illustrative schematic block diagram of a front-end (FE) device 100 (hereinafter "FE device 100") for 5G wireless systems in accordance with various embodiments. In an embodiment, FE device 100 includes circuits, components, and interconnects to transmit and receive Radio Frequency (RF) signals using FDD techniques in the mm-range. In an example, FE device 100 may support multiple mm-wave frequency bands, and the FE device 100 may be frequency tunable.

In an embodiment, FE device 100 includes a power amplifier (PA) 102, a duplexer (DUX) 104 and a low-noise amplifier (LNA) 106. FE device 100 has three external ports (For instance, FE device 100 is a three-port device) and includes a transmit (TX) port 108 (port 1), an antenna (ANT) port 112 (port 2), and a receive (RX) port 110 (port 3). TX port 108 is electrically coupled to PA 102, RX port 110 is electrically coupled to LNA 106, and ANT port 112 is electrically coupled to DUX 104. PA 102 may include one or more power amplifier stages, LNA 106 may include one or more amplifier stages, and DUX 104 may include one or more power dividers and combiners. PA 102, DUX 104, and LNA 106 may be fully-integrated or implemented on a silicon (Si) substrate as a standalone device and within its own electrical chip package. In examples, the semiconductor substrate may be a substrate used in the process of a standard Si, Silicon on insulator (SOI), Gallium-Arsenide (GaAs), or Indium-Phosphide (InP) substrate and so on.

FE device 100 provides benefits over conventional FE modules when operating in 5G systems. For instance, during operation, FE device 100 has high isolation between TX port 108 and RX port to be higher than 50 dB in a frequency range of 0 Hz up to 20 GHz, and higher than 40 dB in the frequency range of 0 Hz up to 60 GHz. Also, insertion loss from the TX port to ANT port may be better than 6.3 dB in the frequency range of 13 GHz-53 GHz, and insertion loss from the antenna port to a RX port may be lower than 13.8 dB in the frequency range of 25 GHz-57 GHz, and around 10.8 dB at 40 GHz. Additionally, in an embodiment, the BiCMOS silicon substrate attenuates leakage of the transmit signal through the silicon substrate using a PA with deep-n-well structures and p-type/n-type grounding guard rings while providing a circuit that has an active area of 2.1 square millimeter (mm²).

PA 102 may receive an input Alternating Current (AC) signal that is injected at TX port 108 and generates a high gain output AC signal at port 114. DUX 104 is coupled to PA 102 at port 116 and is coupled to LNA 106 at port 118. DUX 104 receives the high-gain output AC signal from PA 102 and outputs a TX signal to ANT port 112. Antenna (not shown) is coupled to ANT port 112 and radiates the TX signal from FE device 100 as a transmission signal. Antenna may also receive an input reception signal, which is passed to DUX 104. DUX 104 receives the input reception signal from antenna (not shown) via ANT port 112 and generates a receiver signal at port 118. LNA 106 receives the receiver signal at port 120 and generates an LNA RX signal at RX port 110. As FE device 100 operates using an FDD technique, PA 102 may transmit an output AC signal concurrently that LNA 106 receives the receiver signal from DUX 104. Due to this concurrent operation of both PA 102 and LNA 106 in the duplexing operation, the output AC signal from PA 102 may cause desensitization of LNA 106. DUX 104 may improve isolation between the PA 102 and LNA 106 to at least 40 dB over a frequency range of 15 GHz to 60 GHz.

Figure 2:
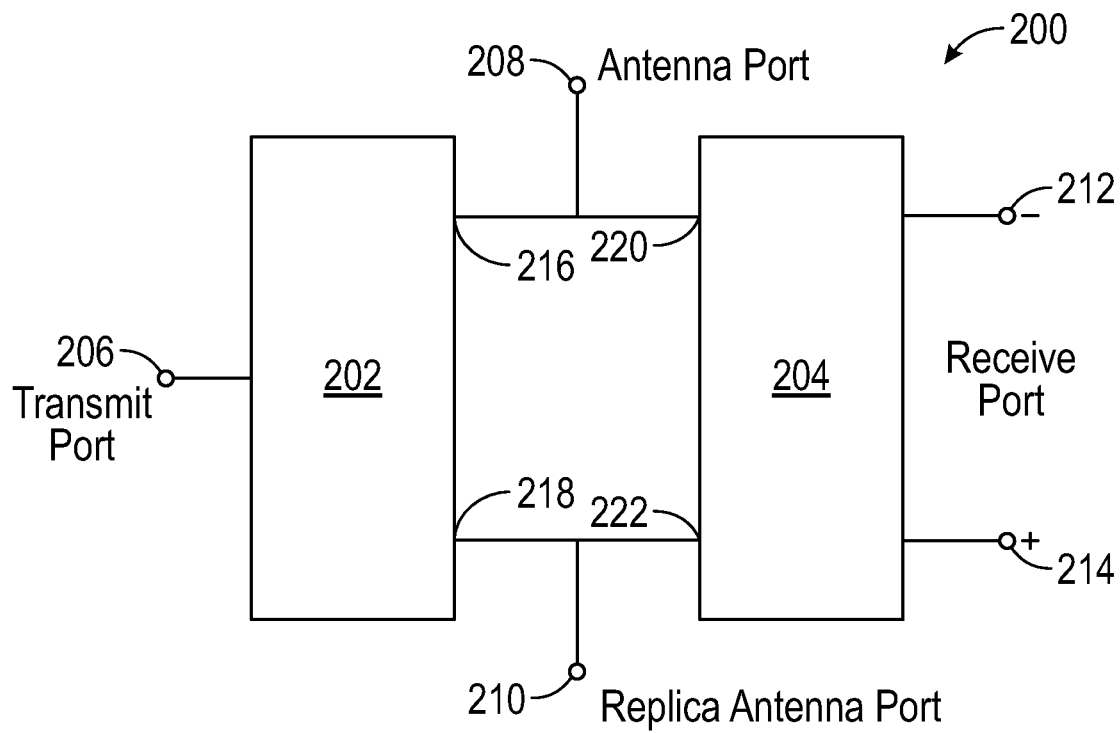
FIG. 2 is an illustrative schematic block diagram of the wideband DUX module of FIG. 1 without the PA and the LNA in accordance with various embodiments.

FIG. 2 shows a block diagram of an integrated DUX in accordance with various embodiments. In an example, DUX 200 may be DUX 104 of FE device 100 that transmits and receives signals from an antenna port in 5G wireless systems in a frequency range of 25 GHz-53 GHz. DUX 200 includes power divider circuit 202, a transformer 204, input port 206, differential output ports 212 and 214, antenna (ANT) port 208, and replica antenna (ANT) port 210. Input port 206 is a single-ended input port of power divider circuit 202 that receives an input AC signal from a power amplifier. In an example, input AC signal may be received from PA 102 (FIG. 1). Power divider circuit 202 is coupled at its input to input port 206 and at its output to output ports 216 and 218. Output port 216 is electrically coupled to ANT port 208, while output port 218 is electrically coupled to replica ANT port 210. Replica ANT port 210 terminates into load resistance $R_L$ ohm (Ω) and provides a matching impedance of ANT port 208 in order to balance an antenna (not shown). Antenna may be coupled to ANT port 208. In embodiments, power divider circuit 202 includes a Wilkinson power divider, which splits the input AC signal at input port 206 into two equal amplitude and equal phase output signals. The equal amplitude and equal phase output signals are output from output ports 216 and 218 and passed to ANT port 208 and replica ANT port 210, respectively. An output signal at ANT port 208 may be transmitted from an antenna (not shown) at ANT port 208. An output signal at replica ANT port 210 dissipates into load resistance $R_L$.

Also shown in FIG. 2, transformer 204 includes input ports 220 and 222, and differential output ports 212 and 214. Input ports 220, 222 are coupled to ANT port 208 and Replica ANT port 210, respectively. Output ports 212 and 214 are configured to be coupled to differential inputs of an LNA receiver, for example, LNA 106. In an embodiment, LNA receiver may be LNA 106 of FIG. 1. Also, output port 212 may be an inverting port (RX−) and output port 414 may be a non-inverting port (RX+). Transformer 204 may be a 1:N or N:1 ratio transformer with a center-tap of the primary or secondary windings coupled to ground. Transformer 204 provides impedance matching at the primary winding to achieve maximum power transfer to the secondary windings and suppresses undesired signal reflection.

Figure 3A:
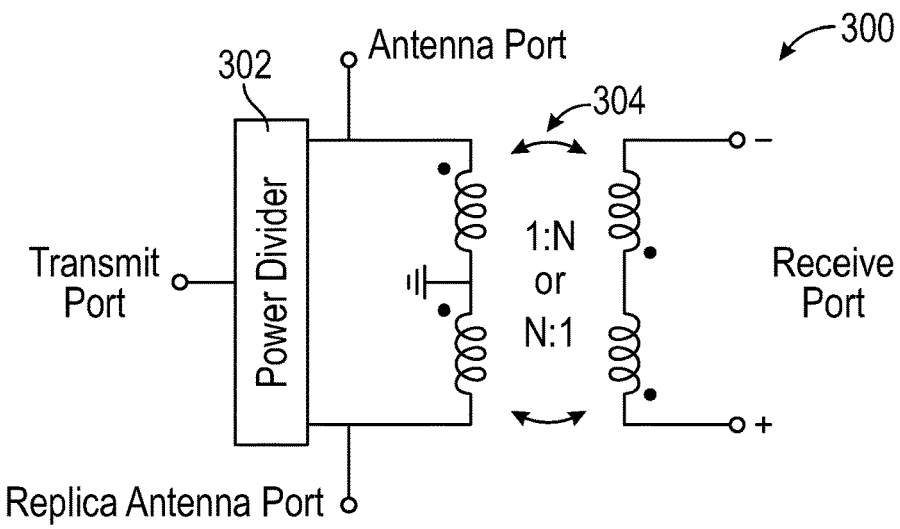
FIG. 3A is an illustrative schematic diagram of the wideband DUX module of FIG. 1 showing its major components in accordance with various embodiments.
Figure 3B:
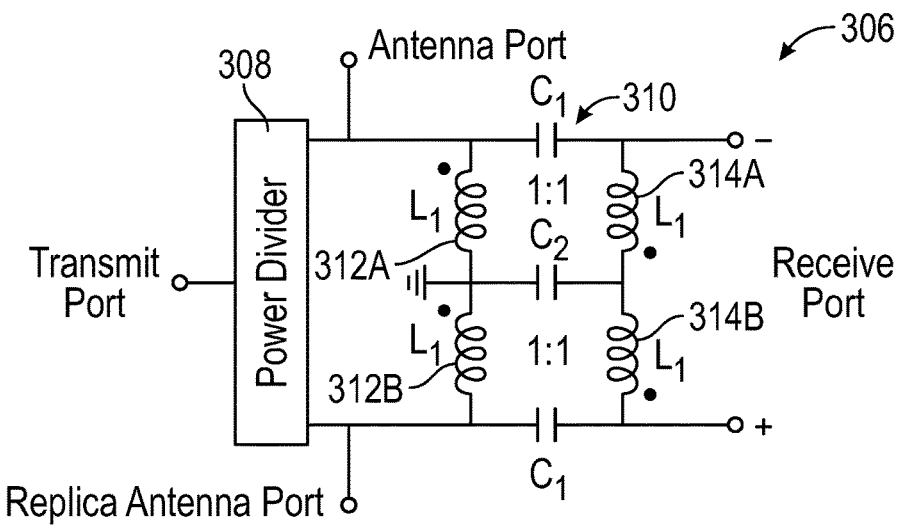
FIG. 3B is an illustrative schematic diagram of the wideband DUX module of FIG. 1 showing its major components in accordance with various embodiments.
Figure 4:
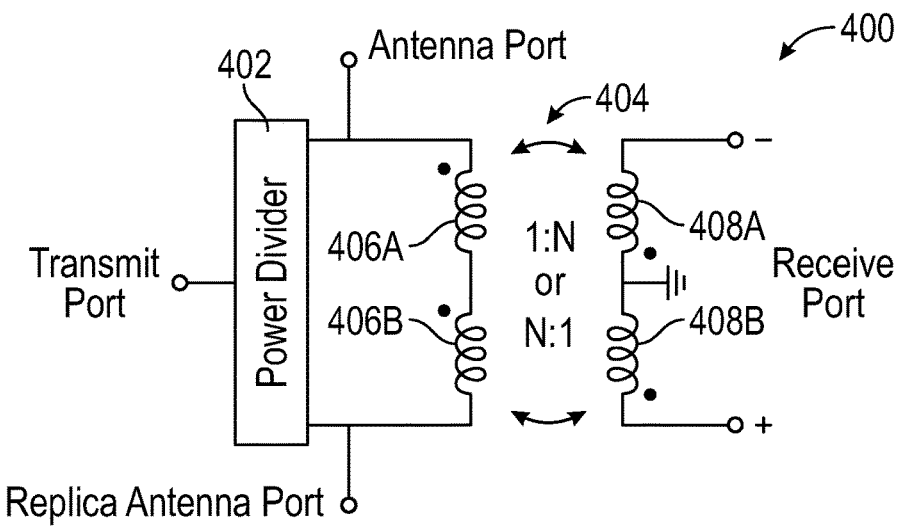
FIG. 4 is another illustrative schematic diagram of the wideband DUX module showing its major components in accordance with various embodiments.

FIGS. 3A, 3B, and 4 show illustrative DUX module designs with a Wilkinson power divider and a grounded center-tap transformer in accordance with various embodiments. In embodiments, FIG. 3A illustrates a DUX module design 300 with Wilkinson power divider 302 and grounded primary center-tap transformer with 1:N or N:1 turns ratio 304. In an embodiment, FIG. 3B illustrates a DUX module design 306 with a Wilkinson power divider 308 and grounded primary center-tap transformer with a 1:1 turns ratio 310. Transformer 310 includes primary windings 312A, 312B, and secondary windings 314A, 314B. Center-tap of primary windings 312A, 312B is grounded (connected to a ground terminal). The grounded center-tap of the transformer significantly improves TX-RX isolation around 20 dB at millimeter-wave frequencies. Additionally, in the time domain, the grounding center-tap also improves the balance of the differential RX signal for Receive port.

FIG. 4 is an illustrative DUX module design 400 with Wilkinson power divider 402 and grounded secondary center-tap transformer with 1:N or N:1 ratio 404. The grounded center-tap of the transformer significantly improve TX-RX isolation around 20 dB at millimeter-wave frequencies. Additionally, in the time domain, the grounding center-tap also improves the balance of the differential RX signal for Receive port.

Figure 5:
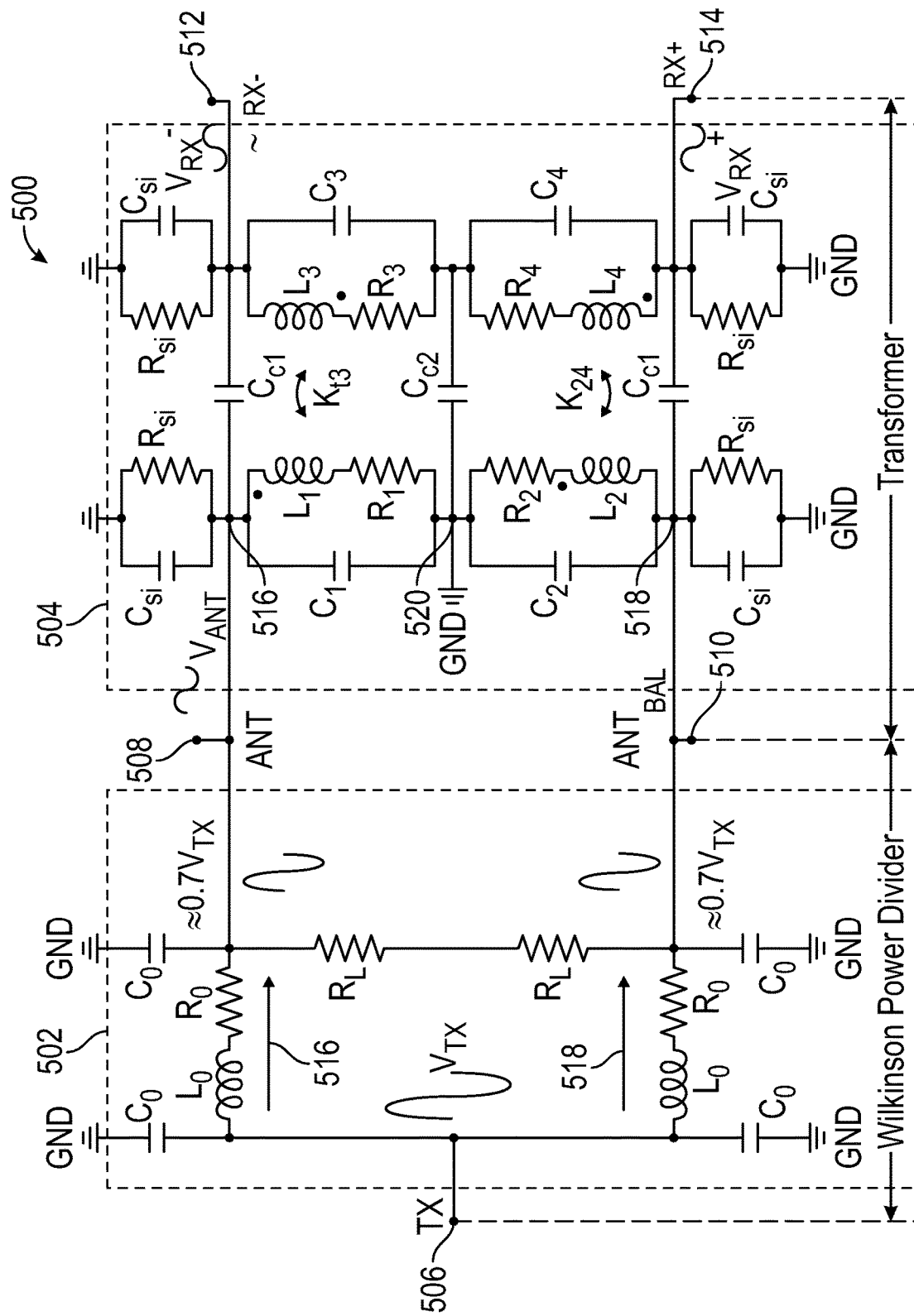
FIG. 5 is an illustrative schematic circuit model of a wideband DUX design module in accordance with various embodiments.

FIG. 5 depicts an equivalent DUX circuit model 500 with Wilkinson power divider 502 with a grounded primary center-tap transformer with 1:1 ratio 504. Transformer 504 includes inductors $L_1$, capacitors $C_1$, $C_2$. Inductors $L_1$ may be the mutual inductances of the primary coil and the secondary coils. DUX 500 demonstrates a design example with power divider and 1:1 ratio grounded primary center-tap transformer to improve TX-RX isolation and insertion loss between the ANT port and the RX port (ILRX). In the design example, the (power-based) insertion loss from ANT port 508 to single-ended RX port 512 $IL_{ANT-RX}^P(\omega)$ may be determined by equation (1).

$$IL_{ANT-RX}^P(\omega) \simeq \frac{k^2 R_{RX}}{\sqrt{1+(R_L/2\omega L_1)^2}} \frac{R_L\|(0.5R_L + 2R_{RX})}{(0.5R_L + 2R_{RX})^2} \quad (1)$$

As shown in equation (1), the higher coupling factor (k) between the transformer coils would lower the insertion loss between ANT and RX port (ILRX).

DUX 500 improves isolation between the input port 506 and RX differential output ports 512, 514 using two primary and secondary coils with a grounded primary center-tapped 1:1 turns-ratio transformer 504. Power divider circuit 502 is coupled to transformer 504 using interconnects that are lossless. Under this condition, a voltage arriving at each of the primary coil terminals 516 and 518 is $0.707V_{TX}$, where $V_{TX}$ is the incident voltage at the input port 506. Due to identical TX signals at the primary coils terminals 516 and 518, the inductive coupling parameters $k_{13}$ and $k_{24}$ may be discarded in the isolation analysis For a simple analysis without loss of generality, the inductor value of $L_1$ and $L_2$ is assumed the same. Due to the circuit symmetry, injected TX power from port 506 would be evenly loaded at 508 and 510, leading to $0.707V_{TX}$ at two antenna ports. For an example case with the center-tap grounded, the (voltage-based) isolation between the input port 506 and a single-end RX output port (512 or 514) can then be derived according to equation (2).

$$ISO_{TX-RX}^{V,G}(\omega) \simeq \frac{1}{\sqrt{2}} \left| \frac{R_{RX}\|\left(sL_1 + \frac{2}{sC_{C2}}\right)}{\frac{1}{sC_{C1}} + \left[R_{RX}\|\left(sL_1 + \frac{2}{sC_{C2}}\right)\right]} \right| \quad (2)$$

While the transformer contributes to the isolation between TX-RX of the DUX 500, impedance mismatches between ANT port 508 and $ANT_{BAL}$ port 510 may also affect the isolation. $ANT_{BAL}$ port 510 may be replica antenna port 210 of FIG. 2. In an example, a voltage difference $\Delta V$ caused by an impedance mismatch $\Delta R$ between ANT port 508 and $ANT_{BAL}$ port 510 may be defined by equation (3).

$$\Delta V \simeq \frac{V_{TX}}{\sqrt{2}} \frac{\Delta R}{R_L} \quad (3)$$

The isolation with grounded center-tap with coupling capacitances $C_{C1}$ and $C_{C2}$ and impedance imbalance at the ANT port 508 and $ANT_{BAL}$ port 510 may be derived from combining equations (1), (2), and (3) to obtain equation (4).

$$ISO_{TX-RX}^{V,G}(\omega) \simeq \frac{1}{\sqrt{2}} \left| \frac{R_{RX}\|\left(sL_1 + \frac{2}{sC_{C2}}\right)}{\frac{1}{sC_{C1}} + R_{RX}\|\left(sL_1 + \frac{2}{sC_{C2}}\right)} \right| + \frac{1}{\sqrt{2}} \frac{\Delta R}{R_L} \frac{1}{\sqrt{1+(R_L/2\omega L_1)^2}} \sqrt{IL_{ANT-RX}^P(\omega)} \quad (4)$$

where the first and second term show the effects of TX leakages through $C_{C1}$ and $\Delta R$, respectively. Eq. (4) indicates clearly that, besides minimizing the parasitic capacitance $C_{C1}$ for reduced leakage, the impedance imbalance $\Delta R$ between two ANT ports needs to be kept as small as possible, which emphasizes the significance of a symmetric layout and antenna impedance balance.

DUX 500 provides impedance matching to 500 at the input port 506, ANT port 508, and differential output ports 512, 514, which facilitates its integration with a PA, an antenna and an LNA. The impedance at the input port 506 is a 50Ω input impedance. The impedance at the ANT port 508 may be matched to 50Ω using the Wilkinson power divider 502. The input impedance looking into the DUX 500 at ANT port 508 may be $R_L//(0.5R_L+2R_{RX})$, where $R_L$ is the termination at the input port 506, ANT port 508 and $ANT_{BAL}$ port 510, and RRX is the termination at the RX ports.

Typically, RRX for optimum gain and noise matching (to the LNAs transistor) is larger than 50 Ohms. Consequently, the input impedance at the ANT port is approximately close to 50Ω. Secondly, the grounding of the primary center-tap improves the TX-RX isolation between TX and RX ports around 20 dB at millimeter-wave frequencies. Additionally, in time domain, the grounded center-tap also improves the balance of the waveforms of differential signals for the receive (RX+ and RX−) ports. Additionally, it also provides a slightly lower insertion loss between input port 506 and ANT port 508. The LC-lumped element Wilkinson power divider provides a low-pass frequency filtered response and functions as a low pass filter to suppress higher-frequency harmonics and leakage signals from the TX port to the RX port.

Figure 6:
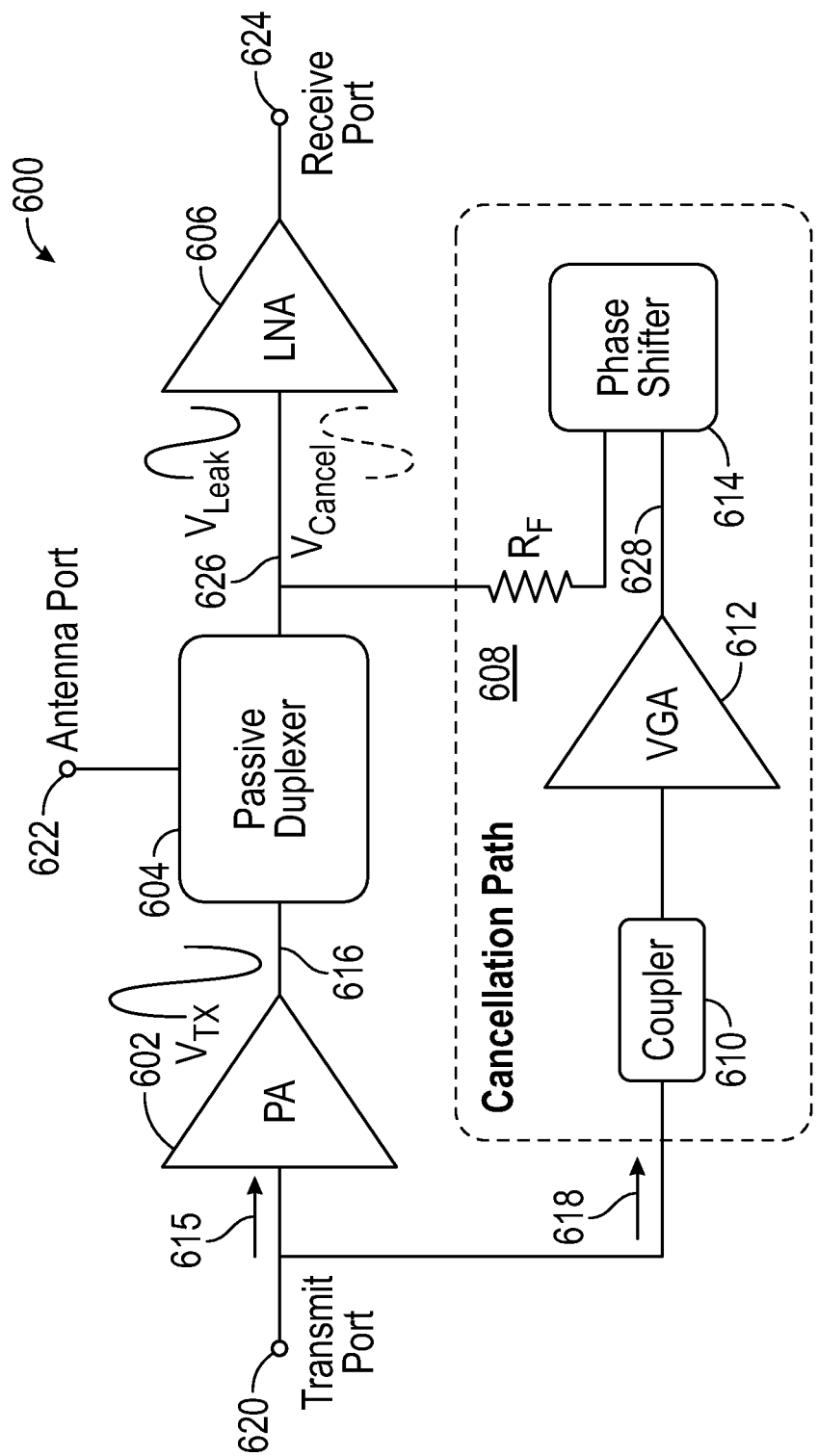
FIG. 6 is an illustrative schematic block diagram of a narrow-band FE device the narrow-band DUX module with an internal PA and LNA in accordance with various embodiments.

FIG. 6 shows an illustrative schematic block diagram of a FE module 600 for a narrowband DUX with an internal PA and LNA in accordance with various embodiments. As shown, FE module 600 includes PA 602, DUX 604, LNA 606, and feed-forward circuit 608. FE module 600 is coupled to three ports—a TX port 620 (port 1), ANT port 622 (port 2), and RX port 624 (port 3). PA 602, DUX 604, and LNA 606 are electrically coupled together along path 615 while feed-forward circuit 608 is arranged along path 618 (also referred to as "cancellation path"). Cancellation path 618 includes active and passive components to change compensation signal intensity to improve isolation between port 620 and port 624. Coupler 610 couples a portion of an input RF signal at TX port 620 to cancellation path 608. Variable gain amplifier (VGA) 612 provides gain to control the voltage intensity of the cancellation signals. Phase Shifter 614 can change the phase of feed-forward signal.

In an embodiment, FE module 600 may be fully-integrated or implemented on a semiconductor substrate. As examples, the semiconductor substrate may be a substrate used in the process of a standard Si, Silicon on insulator (SOI), Gallium-Arsenide (GaAs), or Indium-Phosphide (InP) substrate and so on.

In an embodiment, DUX 604 may be a three-port network device that is implemented with passive components. DUX 604 is used to couple the ANT port 622 to PA 602 and LNA 606. In an example, DUX 604 may be a Wilkinson power divider of FIG. 5. DUX 604 and couples ANT port 622 to PA 602 via port 616, and couples ANT port 622 to LNA 606 via port 626. DUX 604 passes the TX signal from PA 602 to ANT port 622. DUX 604 may also receive a RX signal at ANT port 622 from antenna (not shown). DUX 604 passes the RX signal to LNA 606. LNA 606 amplifies the RX signal and outputs an amplified RX signal at RX port 624.

PA 602 may operate at the same time as LNA 606. PA 602 outputs a transmit signal (identified as $V_{TX}$) at output of PA 602 at port 616. However, a portion of TX signal at port 616 may be passed through DUX 604 to LNA 606 as a DUX 604 leakage signal $V_{Leak}$. The leakage signal $V_{Leak}$ at LNA 606 input at port 626 may also be represented as $V_{TX}$/ISO in the equation (5) below, where $V_{TX}$ is the transmit signal from PA 602 and ISO is the isolation between the two DUX 604 ports (port 616 and port 626). The leakage signal $V_{TX}$/ISO may cause desensitization of LNA 706.

Feed-forward circuit 608 includes transformer coupler 610, variable gain amplifier (VGA) 612, and phase shifter 614. Transformer coupler 610 is a transformer coupled to TX port 620 that is configured to sample an input RF voltage signal from TX port 620 while maintaining high isolation between the input to coupler 610 and TX port 620. In an embodiment, feed-forward circuit 608 may cancel the leakage signal $V_{Leak}$ or attenuate it to a small leakage signal using voltage compensation signal $V_{Cancel}$. $V_{Cancel}$ is the voltage compensation from cancellation path 608. When $V_{Leak}$ and $V_{Cancel}$ are out-of-phase, their amplitudes cancel each other and enables DUX 600 to have the highest isolation performance thereby improving the isolation between TX port 620 and RX port 624.

Figure 7:
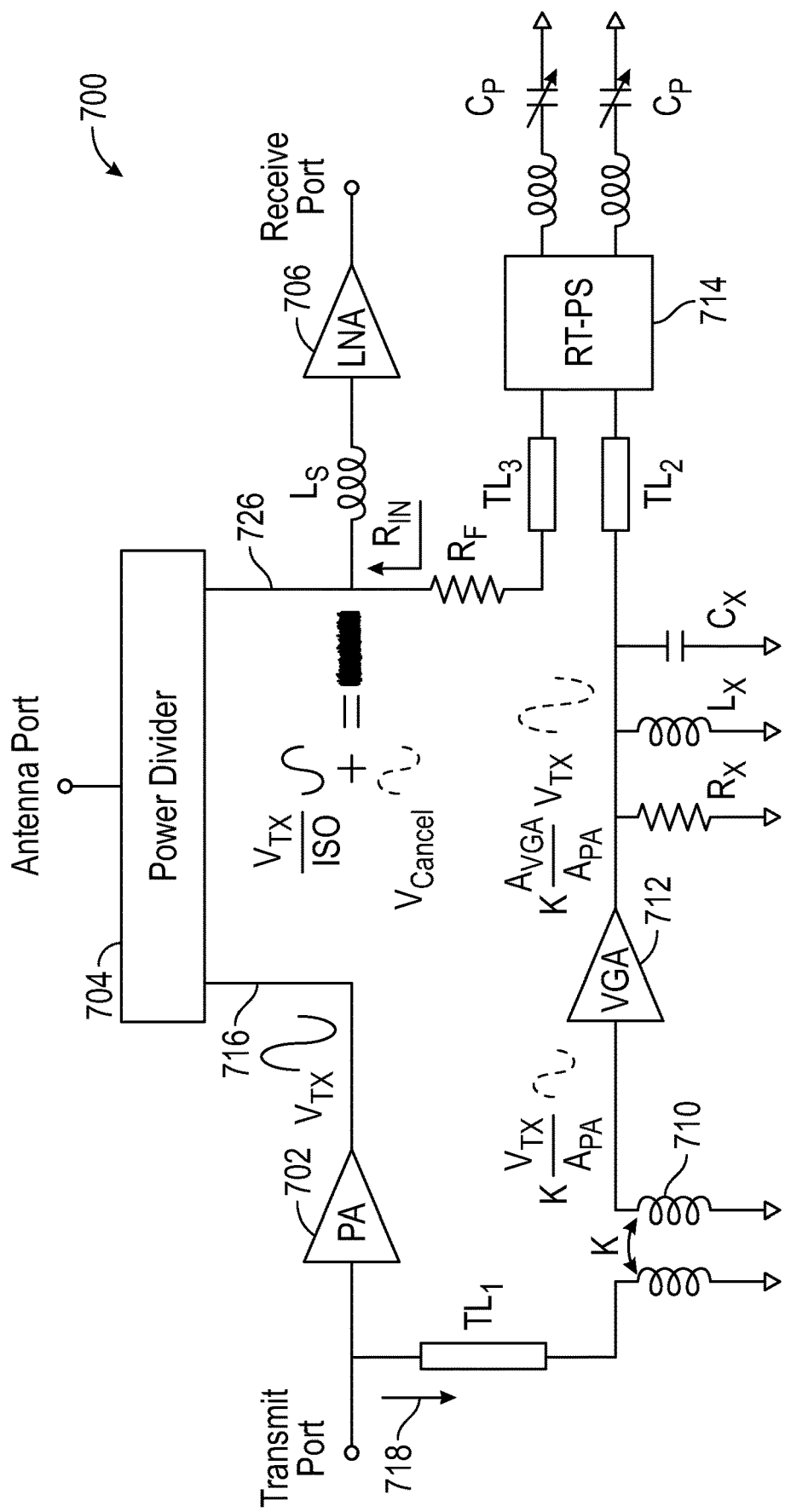
FIG. 7 is a circuit diagram that illustrates a detailed analysis and functional operation of the FE device of FIG. 6 in accordance with various embodiments.

VGA 612 is coupled to the transformer coupler 610 and amplifies the coupler output signal according to the transconductance $g_m$ to output a higher voltage signal to transmission line 628. Phase shifter (PS) 614 can be an analogues PS such as a reflection-type phase-shifter (RT-PS) that is coupled to VGA 612. PS 614 produces a phase-shifted voltage signal that is injected into path 615 using feedback resistor $R_F$. The phase of compensation signal can be controlled be varactor $C_P$ as shown in FIG. 7. In an example, phase-shifted signal may be at 180 degrees to the amplified RF voltage signal at port 626. Feedback resistor $R_F$ feeds the compensated signal $V_{Cancel}$ back to LNA input at port 626 in order to cancel the leakage signal $V_{Leak}$ for higher TX-RX isolation.

FIG. 7 illustrates a schematic diagram 700 that provides a detailed analysis and functional operation of the FE device 600 of FIG. 6 in accordance with various embodiments. Scattering parameters (S-parameters) for FE module 700, for example, RX Gain ($S_{32}$), TX Gain ($S_{21}$), return losses ($S_{11}$, $S_{22}$, & $S_{33}$), and Gain $S_{31}$ may be obtained in relation to the three port networks. A design methodology for achieving improved isolation between ports 716 and 726 while maintaining almost the same NF for DUX 700 may be obtained using schematic diagram 700 and the equations below.

In FIG. 7, a transmission line (TL) may be used to implement a practical layout. For instance, transmission lines $TL_1$, $TL_2$, $TL_3$ also slightly change the phase of the compensation signals, which can be taken into account in the design. For the phase analysis, the phase of leakage signal $V_{Leak}$ and compensation signal $V_{Cancel}$ should be out-of-phase, 180-degree phase difference.

For the amplitude analysis of the compensation path, $V_{Leak}$ is a transmit leakage signal at LNA input and may be written as equation (5).

$$V_{Leak} = \frac{V_{TX}}{ISO} \tag{5}$$

where $V_{TX}$ is signal intensity at PA output of PA 702 and ISO represents the Wilkinson power divider 704 isolation between the two balance ports 716 and 726.

The voltage from the compensation path ($V_{Cancel}$) may be described as equation (6).

$$V_{Cancel} = k \frac{A_{VGA}}{A_{PA}} V_{TX} \simeq k \frac{g_m R_x}{A_{PA}} \frac{R_{in}}{R_F + R_{in}} (1-M) V_{TX} \tag{6}$$

In equation (6), k is the coupling factor of transformer 710 and (1-M) represents the voltage loss from impedance mismatch and frequency response. $A_{VGA}$ and $A_{PA}$ represents the voltage gain of VGA 712 and PA 702, respectively. When RF is much larger than $R_X$ (in Ω), $V_{Cancel}$ may be written as shown in equation (6), where $g_m$ is the conductance of VGA device and $R_{in}$ is the equivalent resistor from RF output looking into LNA input direction.

In order to cancel all leakage from PA output, the voltage amplitude from power divider leakage of DUX 704 ($V_{Leak}$) and cancellation path signal ($V_{Cancel}$) are equal and may be expressed as $$\frac{V_{TX}}{ISO} = k\frac{V_{TX}}{A_{PA}}g_m R_x \frac{R_{in}}{R_F + R_{in}}(1-M) \quad (7)$$

The transconductance of VGA 612 may be derived as $$g_m = \frac{1}{k(1-M)} \frac{A_{PA}}{ISO} \frac{R_F + R_{in}}{R_x R_{in}} \quad (8)$$

Equation (8) can may used for determining the VGA devices size and biasing.

For noise analysis of the compensation path, the total noise figure of the FE module 700 is contributed by noise figure of Wilkinson power divider 704 ($NF_{WK}$), noise figure of PA 702 ($NF_{PA}$), noise figure of LNA 706 ($NF_{LNA}$), and noise figure of VGA 712 along cancellation path 718 ($NF_{VGA}$) as written in equation (9).

$$NF = NF_{WK} + NF_{PA} + NF_{LNA} + NF_{VGA} \quad (9)$$

Assumed a bipolar junction transistor (BJT) equivalent noise source is $2kTg_m$, the noise figure contributed by VGA 712 along cancellation path 718 may be obtained in equation (10).

$$NF_{VGA} = \frac{R_S}{R_F + R_x} + \frac{2kTg_m R_{in}^2 \alpha^2 A_{LNA}^2}{4kTR_s A_{LNA}^2} \quad (10)$$

where $A_{LNA}$ is voltage gain of LNA 706, a is α coefficient, and k is the Boltzmann constant.

Substituting the transconductance ($g_m$) from equation (8) into equation (10) gives the NF in terms of RF as $$NF_{VGA}(R_F) = \frac{R_S}{R_F + R_x} + \frac{\alpha^2}{2k}\frac{A_{PA}}{ISO}\frac{R_{in}}{R_x R_s}\frac{(R_F + R_{in})}{(1-M)} \quad (11)$$

$$\frac{R_S}{R_F + R_x}$$

in equation (11) shows that $R_F$ is inversely proportional to the noise from VGA ($NF_{VGA}$). However, $$\frac{\alpha^2}{2k}\frac{A_{PA}}{ISO}\frac{R_{in}}{R_x R_s}\frac{(R_F + R_{in})}{(1-M)}$$

in equation (11) shows that $R_F$ has direct relationship with $NF_{VGA}$. In other words, it means that optimized $R_F$ could provide a minimum NF value and the highest TX-RX isolation for the entire FE 700 module. Therefore, we can differentiate it and let it equal to zero to get the following equations $$\frac{\partial NF_{VGA}(R_F)}{\partial R_F} = \frac{-R_S}{(R_F + R_x)^2} + \frac{\alpha^2}{2k}\frac{A_{PA}}{ISO}\frac{R_{in}}{R_x R_s}\frac{1}{(1-M)} = 0 \quad (12)$$

The optimized $R_F$ value can be determined as in equation (13)

$$R_{F_{OPT}} = R_s\sqrt{\frac{2k}{\alpha^2}\frac{ISO}{A_{PA}}\frac{R_x}{R_{in}}(1-M)} - R_x \quad (13)$$

The optimized $R_F$ shows that the FE module can achieve the highest TX-RX isolation and maintain the optimum noise figure. $R_F$ is a key component which could determine TX-RX isolation, LNA input matching, and noise figure performance for the RX circuits.

Scattering parameters (S-parameters) for FE device 700, for example, RX Gain ($S_{32}$), TX Gain ($S_{21}$), return losses ($S_{11}$, $S_{22}$, & $S_{33}$), and Gain $S_{31}$ that are obtained in relation to the three port networks include RX Gain ($S_{32}$) of 15 dB, a TX Gain ($S_{21}$) of 12 dB, return loss ($S_{11}$, $S_{22}$, & $S_{33}$) may be greater than 10 dB at 29 GHz, and may improve TX-RX isolation from 50-dB to 70-dB (20-dB improvement), while achieving almost the same NF performance when cancellation path 718 is either ON or OFF.

Figure 8:
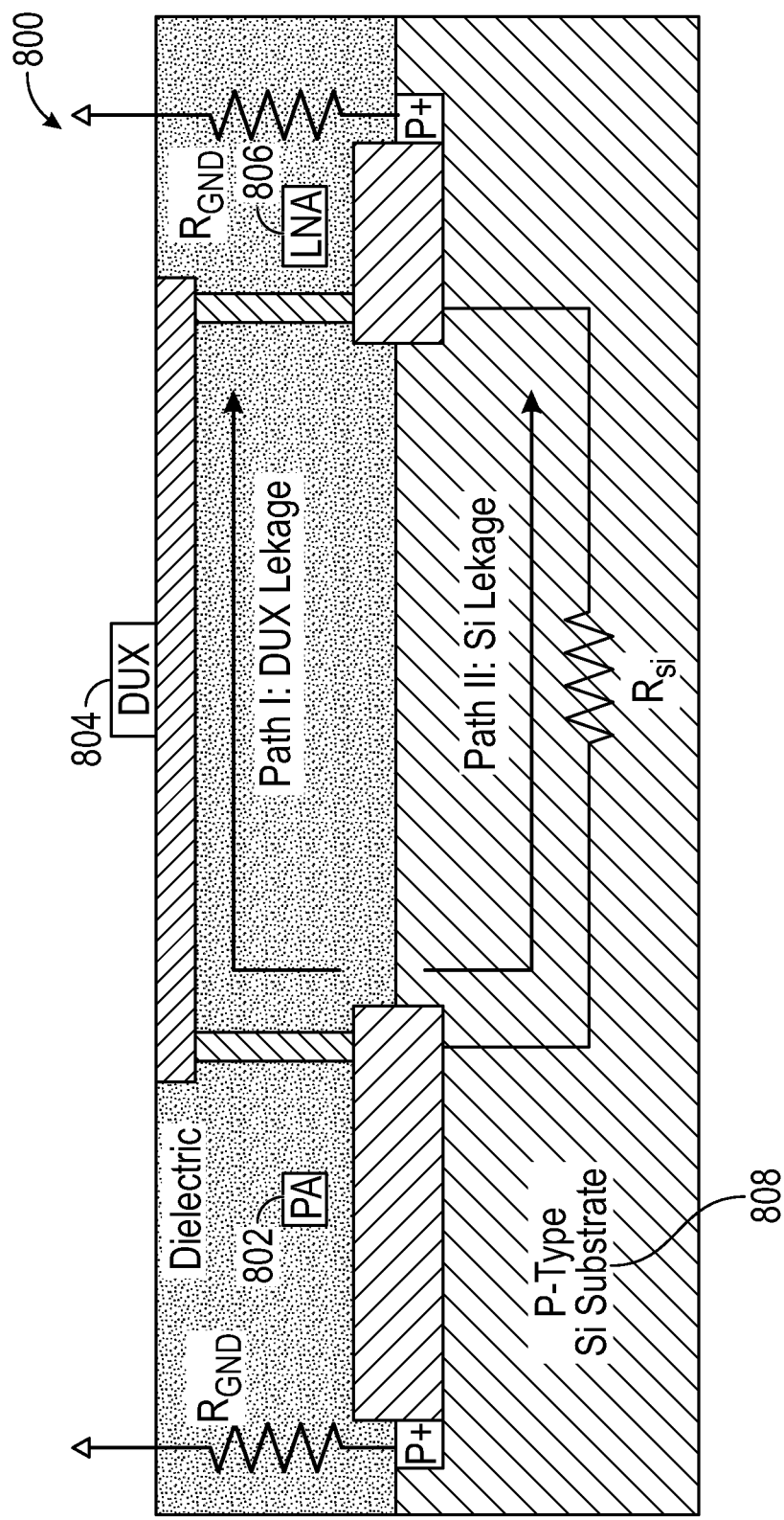
FIG. 8 is an illustrative cross sectional view of a FE device in a semiconductor substrate that illustrates signal leakage paths in accordance with various embodiments.

FIG. 8 is a cross-sectional view of a FE device 800 in a semiconductor substrate that illustrates signal leakage paths in accordance with various embodiments. In embodiments, FE device 800 may be FE device 100 of FIG. 1 and includes a PA 802, DUX 804, and LNA 806. In FE device 800, signal leakage paths may be from (1) DUX 804 (DUX leakage) and (2) from a low-resistivity p-type silicon (Si) substrate 808 (Si leakage). Si leakage is a common yet important issue in silicon-based RF integrated-circuit (RFIC) design, particularly for large RFICs and/or with TX and RX circuits integrated together. In order to achieve high isolation between TX and RX for a FE module, Si Leakage path needs to be considered and suppressed. cross sectional view of a FE device in a semiconductor substrate The total TX leakage $V_{Leak}$ through FE device 800 and to an LNA input may be expressed as $V_{Leak} \approx V_{TX}(ISO_{DUX} + ISO_{Si})$, where $ISO_{DUX}$ is the TX-RX isolation of the DUX itself and $ISO_{Si}$ is the leakage ratio through Si substrate. It is assumed that $ISO_{DUX}$ is about 45 dB. To achieve a total isolation better than 45 dB, $ISO_{Si}$ should at least be higher than 55 dB, making the leakage through the Si substrate important and needs to be minimized. $R_{GND}$ represents the resistance of the ground via from the p-type Si substrate to the topmost metal ground plane, typically around 0.1-0.5 Ohm, that can be reduced by including more solid contacts between the Si substrate and top-layer ground plane. Second, p- and n-type ground guard rings surrounding the PA 802 and LNA 806 are implemented. Also, deep trenches are implemented at the boundary between the PA output and LNA inputs to block the TX leakage through the Si substrate (Si leakage).

While the embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the invention. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A front end (FE) device for a 5th Generation (5G) wireless communication application, comprising:
    a single silicon substrate;
    a duplexer (DUX) comprising a power divider and a transformer, wherein the power divider and the transformer are implemented on the silicon substrate;
    a power amplifier (PA) coupled to the DUX and comprising a main amplifier stage and a PA output port, wherein the PA output port is coupled to the power divider and wherein the PA is implemented on the silicon substrate; and
    a low-noise amplifier (LNA) coupled to the power divider and implemented on the silicon substrate, wherein the DUX, the PA, and the LNA are fully-integrated onto the silicon substrate as a standalone device.

2. The FE device of claim 1, wherein the LNA comprises LNA input ports, and wherein the FE device further comprises:
    a transmit (TX) port coupled to the PA and configured to inject a transmitting signal;
    an antenna (ANT) port coupled to the DUX and configured to transmit and receive signals to and from the air; and a receive (RX) port coupled to the LNA input ports.

3. The FE device of claim 2, further comprising a feed forward circuit coupled between the TX port and the RX port, wherein the feed forward circuit is configured to generate a compensation signal that suppresses a leakage signal from the DUX.

4. The FE device of claim 3, wherein the feed forward circuit comprises:
    a transformer coupler coupled to the TX port and configured to output a portion of an input signal from the TX port as a first signal;
    a variable gain amplifier (VGA) coupled to the transformer coupler and configured to amplify the first signal as a second signal; and
    a phase shifter coupled to the VGA and to the LNA and configured to output a phase-shifted signal of the second signal as the compensation signal.

5. The FE device of claim 2, wherein the transformer is a 1:N turns ratio transformer or a N:1 turns ratio transformer comprising a coils ratio, and wherein the coils ratio is capable of being increased to increase isolation between the TX port and the RX port or to lower insertion loss between the ANT port and the RX port.

6. The FE device of claim 5, wherein the 1:N turns ratio transformer or the N:1 turns ratio transformer comprises primary windings and secondary windings, wherein a center tap of the primary windings or the secondary windings is configured to be coupled to ground for increasing the balance of RX differential signals.

7. The FE device of claim 6, wherein the primary windings comprise inductances that are configured to reduce TX insertion loss.

8. The FE device of claim 5, wherein the transformer comprises primary windings and secondary windings, and wherein a center tap of the primary windings or the secondary windings is configured to be coupled to ground for lowering a TX insertion loss.

9. The FE device of claim 5, wherein the transformer comprises primary windings and secondary windings, and wherein a center tap of the primary windings or the secondary windings is configured to be coupled to ground for increasing TX-RX isolation and for increasing the balance of RX differential signals.

10. The FE device of claim 2, wherein the ANT port is coupled to the transformer, wherein the TX port is coupled to the power divider, and wherein the FE device further comprise differential output receive (RX) ports coupled to the transformer.

11. The FE device of claim 2, wherein the TX port comprises an input impedance that is a characteristic impedance of the PA.

12. The FE device of claim 2, further comprising a second ANT port coupled to the power divider, wherein the ANT port comprises a first impedance, and wherein the second ANT ports comprise the first impedance.

13. The FE device of claim 12, wherein the power divider is configured as a Wilkinson power divider, and wherein the power divider is configured to provide an equal phase output signal to each of the ANT port and to the second ANT port.

14. The FE device of claim 1, wherein the PA is configured to output a PA signal, and wherein the DUX further comprises a power divider that is configured as a Wilkinson power divider, and wherein the power divider is configured to provide a low pass response to the PA signal.

15. The FE device of claim 14, wherein the Wilkinson power divider is configured to provide a low pass response to an input signal that is received from a power amplifier.

16. The FE device of claim 1, wherein the DUX comprises a single-ended input port and differential output ports.

17. The FE device of claim 16, wherein the single-ended input port comprises a first impedance, wherein the PA comprises a PA output impedance, and wherein the first impedance is matched to the PA output impedance.

18. The FE device of claim 16, wherein the LNA comprises an LNA input impedance, wherein each of the differential output ports comprise a second impedance, and wherein the second impedance is matched to the LNA input impedance.

* * * * *